(12) United States Patent
Kim et al.

(10) Patent No.: US 8,722,174 B2
(45) Date of Patent: May 13, 2014

(54) METHOD OF FORMING SELF-ASSEMBLED PATTERNS USING BLOCK COPOLYMERS, AND ARTICLES THEREOF

(71) Applicant: International Business Machines Corporation, Armonk, NY (US)

(72) Inventors: Ho-Cheol Kim, San Jose, CA (US); Sang-min Park, San Jose, CA (US); Charles T. Rettner, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/709,397

(22) Filed: Dec. 10, 2012

(65) Prior Publication Data

US 2013/0099362 A1 Apr. 25, 2013

Related U.S. Application Data

(62) Division of application No. 12/554,175, filed on Sep. 4, 2009, now Pat. No. 8,349,203.

(51) Int. Cl.
*B32B 3/00* (2006.01)

(52) U.S. Cl.
USPC ............ 428/172; 428/156; 428/161; 428/167

(58) Field of Classification Search
USPC .................................. 428/156, 161, 167, 172
See application file for complete search history.

(56) References Cited

U.S. PATENT DOCUMENTS

| | | | |
|---|---|---|---|
| 6,746,825 B2 | 6/2004 | Nealey et al. | |
| 7,347,953 B2 | 3/2008 | Black et al. | |
| 2006/0240240 A1 | 10/2006 | Cha et al. | |
| 2007/0175859 A1 | 8/2007 | Black et al. | |
| 2007/0183025 A1 | 8/2007 | Asakawa et al. | |
| 2007/0224819 A1 | 9/2007 | Sandhu | |
| 2007/0224823 A1 | 9/2007 | Sandhu | |
| 2007/0293041 A1 | 12/2007 | Yang et al. | |
| 2008/0099845 A1 | 5/2008 | Yang et al. | |
| 2008/0102252 A1 | 5/2008 | Black et al. | |
| 2008/0233343 A1 | 9/2008 | Cheng et al. | |

FOREIGN PATENT DOCUMENTS

WO 03023518 A1 3/2003

OTHER PUBLICATIONS

Black, C.T., et al. "Polymer self assembly in semiconductor microelectronics", IBM J. Res & Dev. vol. 51, No. 5, Sep. 2007, pp. 605-633.
Cheng, Joy Y., et al. "Nanostructure engineering by templated self-assembly of block copolymers", Nature Materials, vol. 3, www.nature.com/naturematerials, Nov. 2004, pp. 823-828.

(Continued)

*Primary Examiner* — Catherine A Simone
(74) *Attorney, Agent, or Firm* — Cantor Colburn LLP (57) ABSTRACT

A method of forming a block copolymer pattern comprises providing a substrate comprising a topographic pre-pattern comprising a ridge surface separated by a height, h, greater than 0 nanometers from a trench surface; disposing a block copolymer comprising two or more block components on the topographic pre-pattern to form a layer having a thickness of more than 0 nanometers over the ridge surface and the trench surface; and annealing the layer to form a block copolymer pattern having a periodicity of the topographic pre-pattern, the block copolymer pattern comprising microdomains of self-assembled block copolymer disposed on the ridge surface and the trench surface, wherein the microdomains disposed on the ridge surface have a different orientation compared to the microdomains disposed on the trench surface. Also disclosed are semiconductor devices.

16 Claims, 7 Drawing Sheets

(56) References Cited

OTHER PUBLICATIONS

Cheng, Joy Y., et al. "Rapid directed self assembly of lamellar microdomains from a block copolymer containing hybrid", Appl. Phys. Lett vol. 91, 2007 pp. 143106-1-143106-3.

Hawker, Craig J., et al. Block Copolymer Lithography: Merging "Bottom-Up" with "Top-Down" Processes, MRS Bulletin, vol. 30, Dec. 2005, www.mrs.org/publications/bulletin, pp. 952-966.

Kim, Sang Ouk et al., "Epitaxial self-assembly of block copolymers on lithographically defined nanopatterned substrates", Letters to Nature, vol. 424, www.nature.com/nature, Jul. 24, 2003, pp. 411-414.

Park, et al., "Block Copolymer Lithography: Periodic Arrays of ~10 Holes in 1 Square Centimeter", Science, vol. 276, www.sciencemag.org, May 30, 1997, pp. 1401-1404.

Park, Sang-Min, et al. "Directed Assembly of Lamellae-Forming Block Copolymers by Using Chemicall and Topographically Patterned Substrates**", Advanced Materials, vol. 19, 2007, pp. 607-611.

Park, Cheolmin et al., "Enabling nanotechnology with self assembled block copolymer patterns", Science Direct, Polymer 44, www.sciencedirect.com; Jul. 29, 2003, pp. 6725-6760.

Rockford, L., et al. Polymers on Nanoperiodic, Heterogeneous Surfaces, Physical Review Letters, vol. 82, No. 12, 1999 The American Physical Society, Mar. 22, 1999, pp. 26022605.

Ruiz, Ricardo, et al. "Local Defectivity Control of 2D Self-Assembled Block Copolymer Patterns**", Advanced Materials, vol. 19, 2007, pp. 2157-2162.

Segalman, Rachel et al., Graphoepitaxy of Spherical Domain Block Copolymer Films **, Advanced Materials, vol. 13, No. 15, Aug. 3, 2001, pp. 1152-1155.

Segalman, Rachel A. "Patterning with block copolymer thin films", Materials Science and Engineering Reports 48; A Review Journal, (2005), pp. 191-226.

Stoykovich, Mark P., et al. "Directed Assembly of Block Copolymer Blends into Nonregular Device-Oriented Structures", Science Magazine, vol. 308, Jun. 3, 2005, pp. 114-1446.

Sundrani, Deepak, et al. Guiding Polymers to Perfection: Macroscopic Alignment of Nanoscale Domains, Nano Letters, vol. 4, No. 2, 2004, pp. 273-276.

METHOD OF FORMING SELF-ASSEMBLED PATTERNS USING BLOCK COPOLYMERS, AND ARTICLES THEREOF

CROSS REFERENCE TO RELATED APPLICATIONS

This application is a DIVISIONAL application of and claims priority to U.S. application Ser. No. 12/554,175, filed on Sep. 4, 2009, incorporated herein by reference in its entirety.

BACKGROUND

The present disclosure is related to a method of forming patterns of sub-optical lithographic dimensions using self-assembly of block copolymers, and articles thereof.

Block copolymers, consisting of two or more distinct homopolymers joined end to end, self-assemble into periodic microdomains having typical dimensions of 10 nanometers to 50 nanometers (nm). The possibility of using such microdomains to pattern surfaces has attracted increasing interest because of the expense and difficulty of patterning in nanoscale dimensions (especially sub-45 nm) using optical lithography.

Controlling the lateral placement of the block copolymer microdomains on the substrates continues to be a challenge. This problem has been previously addressed using lithographically pre-defined topographic and/or chemical patterning of the substrate. Previous studies have demonstrated that self-assembled block copolymer microdomains in form of lamellae can be directed to follow chemical patterning of the substrate, yielding periodicities close to those of the chemical pre-patterns. Other studies have shown that by controlling the surface wetting properties of the block copolymer on the bottom and side walls of a topographic pre-pattern, the lamellae can be directed to follow the topographic pre-pattern. The lamellae formed line/space patterns of smaller dimensions than the substrate pre-pattern, subdividing the topographic pre-pattern into a higher frequency line pattern; that is, a line pattern having a smaller pitch. One limitation of block copolymer patterning is the propensity of the patterns to form everywhere on the pre-pattern surface, for topographic and/or chemical guiding pre-patterns.

Thus, new methods are desired for forming self-assembled block copolymer nanopatterns having controlled lateral placement of the microdomains on the substrate.

BRIEF SUMMARY

A method of forming a block copolymer pattern comprises providing a substrate comprising a topographic pre-pattern comprising a ridge surface separated by a height, h, greater than 0 nanometers from a trench surface; disposing a block copolymer comprising two or more block components on the topographic pre-pattern to form a layer having a thickness of more than 0 nanometers over the ridge surface and the trench surface; and annealing the layer to form a block copolymer pattern having a periodicity of the topographic pre-pattern, the block copolymer pattern comprising microdomains of self-assembled block copolymer disposed on the ridge surface and the trench surface, wherein the microdomains disposed on the ridge surface have a different orientation compared to the microdomains disposed on the trench surface.

A semiconductor device comprises a substrate, the substrate comprising a topographic pre-pattern comprising a ridge surface separated by a height, h, greater than 0 nanometers from a trench surface; and a layer comprising a block copolymer disposed on the substrate, the block copolymer comprising two or more block components, and the layer having a thickness of more than 0 nanometers over the ridge surface and the trench surface; wherein the layer comprises a block copolymer pattern having a periodicity of the topographic pre-pattern, the block copolymer pattern comprising microdomains of self-assembled block copolymer disposed on the ridge surface and the trench surface, wherein the microdomains disposed on the ridge surface have a different orientation compared to the microdomains disposed on the trench surface.

The disclosure may be understood more readily by reference to the following detailed description of the various features of the disclosure and the examples included therein.

DETAILED DESCRIPTION

Disclosed is a method for controlling lateral placement of sub-optical patterns formed by block copolymer thin films. The method produces discrete patterns by means of topographically directed self-assembly of the block copolymer. Thus, the formation of the block copolymer pattern is controlled by the block copolymer film thickness, and the lateral placement of the block copolymer pattern is controlled by the substrate surface topography. Thus, the block copolymer patterns replicate the spacing, or periodicity, of the underlying topographic pre-pattern of the substrate. The method does not rely on chemical modification of the substrate. The method makes it possible to generate new types of lamellar patterns having controlled placement of the block copolymer pattern on a topographic pre-pattern. Unlike other directed self-assembly methods of block copolymers that provide patterns continuously covering the substrates, the disclosed method provides new types of discrete patterns that can be formed on selected portions of a substrate, which can be directly applicable to device fabrications.

The substrate can comprise one or more layers. The topmost layer has a surface comprising a topographic pre-pattern, such as for example a lithographic line pattern. The topographic pre-pattern has at least one surface feature comprising a ridge surface separated by a height, h, greater than 0 nanometers from a lower lying trench surface. The ridge surface comprises at least one ridge surface area having a preferential affinity for one of the block components of the block copolymer.

The block copolymer comprises two or more polymeric block components. The block components are derived from different chemical monomers. For example, a block copolymer can comprise a polystyrene block component (A) and a poly(alkyl (meth)acrylate) block (B), represented by the formula $(A-b-B)_x$, wherein each block can have a different number average molecular weight, and wherein the poly(alkyl (meth)acrylate) block can be derived from either an acrylate or a methacrylate monomer. More specifically, block component (B) can be poly (methyl methacrylate). No limitation is placed on the number of the A-B diblock sequences in the block copolymer; that is, x in the formula $(A-b-B)_x$ is an integer greater than or equal to 1. In one embodiment, the block copolymer consists essentially of, or exclusively of two block components, and x is 1.

The block copolymer is disposed in the form of a film layer on the substrate topographic pre-pattern. The layer has a thickness, t', over the ridge surface and a thickness, t, over the trench surface, where t' and t are each greater than 0 nanometers and t' is less than t. Annealing the layer results in a block copolymer pattern having a periodicity of the topographic pre-pattern. The block copolymer pattern is comprised of microdomains of self-assembled block copolymer disposed on the ridge surface and the trench surface, wherein a microdomain disposed on the ridge surface has a different orientation compared to a microdomain disposed on the trench surface. The difference in orientation is detectable on a macro-scale as the block copolymer pattern. Herein, the term "block copolymer pattern" refers to a pattern resulting from the ordered assembly of microdomains based on their orientation relative to the underlying surface. The block copolymer pattern periodicity is a macro-scale periodicity controlled by the underlying topographic pre-pattern and therefore replicates the periodicity of the underlying topographic pre-pattern. The block copolymer pattern periodicity is distinguished from lamellar periodicity, described below. Lamellar periodicity is a micro-scale periodicity derived from the ordered self-assembly of block copolymer molecules, and is controlled by the block copolymer structure, not the underlying topographic pre-pattern.

More specifically, annealing the block copolymer layer causes the block copolymer to self-assemble into lamellar microdomains disposed on the ridge surface and the trench surface. The lamellar microdomains can have either a parallel or perpendicular orientation relative to the underlying pre-pattern surface plane; that is, the lamellar "plane" can be parallel or perpendicular to the underlying surface plane. The lamellae that form over the trench surface are substantially oriented parallel to the underlying trench surface plane, whereas the lamellae that form over the ridge surface are substantially oriented perpendicular to the underlying ridge surface plane. The difference in planar orientation of the lamellae can be detected as a block copolymer pattern by SEM when viewed from above the pre-pattern surface plane. In the SEM, the lamellae having a parallel orientation relative to the underlying surface plane appear free of structure, while lamellae having perpendicular orientation show structured contrast regions.

The lamellar microdomains disposed on the ridge surfaces having a perpendicular orientation can extend partially over the trench surface area. Further, the lamellar microdomains having a perpendicular orientation may also be substantially or exclusively located on the ridge surface.

Hereinafter the pre-patterned topographic surface of the substrate will be referred to simply as the "pre-pattern".

No limitation is placed on the configuration of the underlying pre-pattern or the pattern formed by the block copolymer coated thereon, with the proviso that the desirable block copolymer properties are not adversely affected; for example, the self-assembly of the block components to form microdomains on ridge surfaces during annealing, or the formation of detectably different microdomain orientations on the ridge surface. The pre-pattern can comprise surface features in the form of different geometric shapes; for example parallel lines, grids, polygons, concentric circles, arcs, curvilinear shapes, open angles, or combinations thereof. The block copolymer pattern replicates the periodicity of the underlying pre-pattern, and therefore the block copolymer pattern can also comprise parallel lines, grids, polygons, circles, arcs, curvilinear shapes, open angles, or combinations thereof, having a size and shape corresponding to the underlying pre-pattern.

Figure 1:
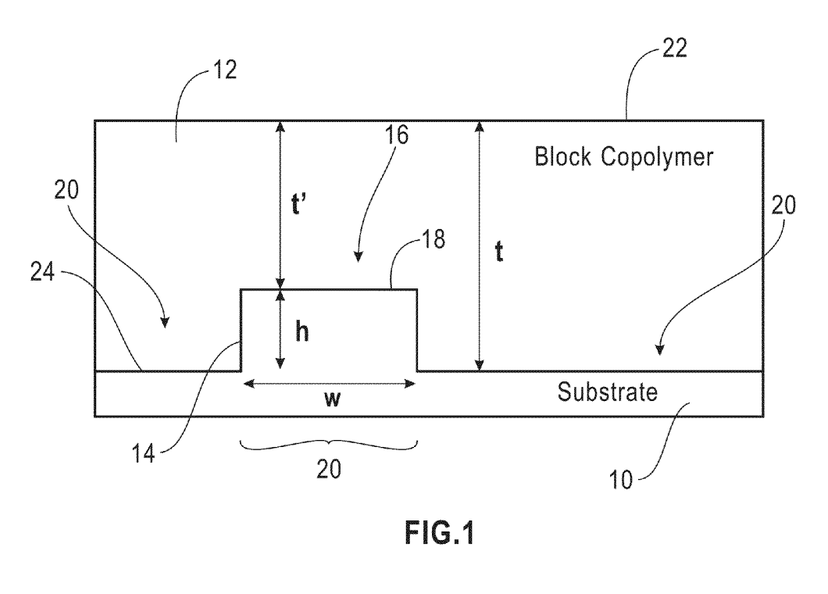
FIG. 1 is a schematic representation of the pattern formation resulting from the disclosed method. The height, h, of the surface feature is about $L_o/2$ of lamellar periodicity of block copolymer. The thickness, t', of block copolymer on top of the ridge surface is $L_o$ for asymmetric wetting block copolymers, and $L_o/2$ for symmetric wetting block copolymers.

FIG. 1 is a schematic cross-sectional view of a non-limiting example of a substrate 10 comprising a pre-pattern having a block copolymer layer 12 disposed thereon, wherein the view is a close-up of a surface feature 20 of the underlying pre-pattern. Surface 22 of the block copolymer layer 12 is in contact with the air. Surface feature 20 has width, w, and comprises sidewall 14 and ridge 16 having ridge surface 18, adjacent to trench 20 comprising trench surface 24. Ridge surface 18 is displaced above trench surface 24 by a height, h. The block copolymer layer 12 is a non-conformal layer, meaning that it varies in thickness with the surface features of the underlying pre-pattern as shown in FIG. 1. Thus, the thickness, t, of block copolymer layer 12 above trench surface area 24 is greater than thickness, t', of the block copolymer layer 12 over ridge surface area 18. The substrate can comprise additional layers (not shown), the topmost layer which comprises the pre-pattern.

The term "annealing" or "anneal" as used herein refers to treatment of the block copolymer so as to allow sufficient phase separation between two or more different block components of the block copolymer to promote self-assembly of the block components into an ordered pattern having repeating structural units. Annealing of the block copolymer can be achieved by various methods known in the art, including, but not limited to: thermal annealing (either in a vacuum or in an inert atmosphere containing nitrogen or argon), ultra-violet annealing, laser annealing, solvent vapor-assisted annealing (either at or above room temperature), or supercritical fluid-assisted annealing. As a specific example, thermal annealing of the block copolymer can be conducted at an elevated temperature that is above the glass transition temperature (Tg), but below the degradation temperature (Td) of the block copolymer.

The wetting properties as discussed herein refer to the surface affinities of a specific surface with respect to the different block components of the block copolymer. For example, if a surface has substantially the same surface affinity to both block components A and B of a block copolymer, such a surface is considered a neutral surface or a non-preferential surface, i.e., both block components A and B can wet or have affinities to such a surface. In contrast, if a surface has significantly different surface affinities for the block components A and B, such a surface is then considered a preferential surface, i.e., only one of block components A and B can wet such a surface, but the other cannot.

A symmetric wetting block copolymer is defined as one that when coated on a surface and annealed will self-assemble to place block components of the same chemical composition in contact with the pre-pattern surface and air interface. For example, an A-B diblock copolymer would be symmetrically wetting if it self-assembles to place the A block in contact with the pre-pattern surface and the air interface; likewise if it self-assembles to place the B block in contact with the pre-pattern surface and air interfaces.

An asymmetric wetting block copolymer is defined as one that when coated on a pre-pattern surface and annealed, will self-assemble to place copolymer blocks having different chemical compositions in contact with the pre-pattern surface and the air interface. For example, A-B diblock copolymer would be asymmetrically wetting if it self-assembled to place the A block in contact with the pre-pattern surface and the B block in contact with the air interface, or if the B block was in contact with the pre-pattern surface and the A block was in contact with the air interface.

In another more explicit example of symmetric wetting, if poly(styrene-block-methyl methacrylate) (PS-b-PMMA, a diblock copolymer) is coated onto a hydrophobic surface and annealed, the (PS) block arranges to be in contact with the hydrophobic surface, followed by poly(methyl methacrylate) (PMMA), PMMA, and PS blocks sequentially stacked thereon. The upper and outermost PS block has a low surface energy and preferentially arranges to be in contact with the air interface. This is symmetric wetting because PS blocks are in contact with the hydrophobic surface and the air interface.

In a more explicit example of asymmetric wetting, if PS-b-PMMA is coated on a hydrophilic surface and thermally treated, the first block in contact with the hydrophilic surface will be the PMMA block, followed sequentially by PS, PS, PMMA, PMMA, and PS blocks stacked thereon, with PS at the air interface. This is asymmetric wetting because the PMMA block contacts the hydrophilic surface and a PS block contacts the air interface.

$L_0$ refers to the natural periodicity of the block copolymer, or the length of the repeating structural unit of the self-assembled block copolymer. More generally, in a diblock copolymer A-B, the structural repeat unit is A-B in a stacked structure. In a triblock copolymer A-B-C, the structural repeat unit is A-B-C. In the above example of A-B diblock copolymer, the A-B polymer chains self-assemble in an A-B B-A A-B sequential pattern. $L_0$ consists of two lamellar domains, one lamellar domain consisting of the two adjacent B blocks and another lamellar domain consisting of the two adjacent A blocks. This shown also in FIG. 7, described below. The length, $L_0$, can be calculated from the number average molecular weight (or degree of polymerization, N) of each block in the block copolymer.

Continuing with the non-limiting example of a diblock copolymer, when a topographic pre-pattern that has been coated with a film of the diblock copolymer is annealed at a high temperature, typically above the glass transition temperature, $T_g$, of the diblock copolymer, a molecular rearrangement can occur in the layer to form a stacked assembly of copolymer blocks. In symmetric wetting cases, a quantized block copolymer thickness of $nL_0$ is obtained. In asymmetric wetting cases, a quantized block copolymer thickness of $(n+\frac{1}{2})L_0$ is obtained. In each case, n is an integer greater than zero. In a region where the initial thickness is thinner than a quantized thickness after the thermal treatment, a hole is formed. In a region where the initial thickness is thicker than a quantized thickness after the thermal treatment, an island is formed. In the disclosed method, the thickness variation of the block copolymer film becomes $L_0$ by self-assembly upon annealing.

Figure 6:
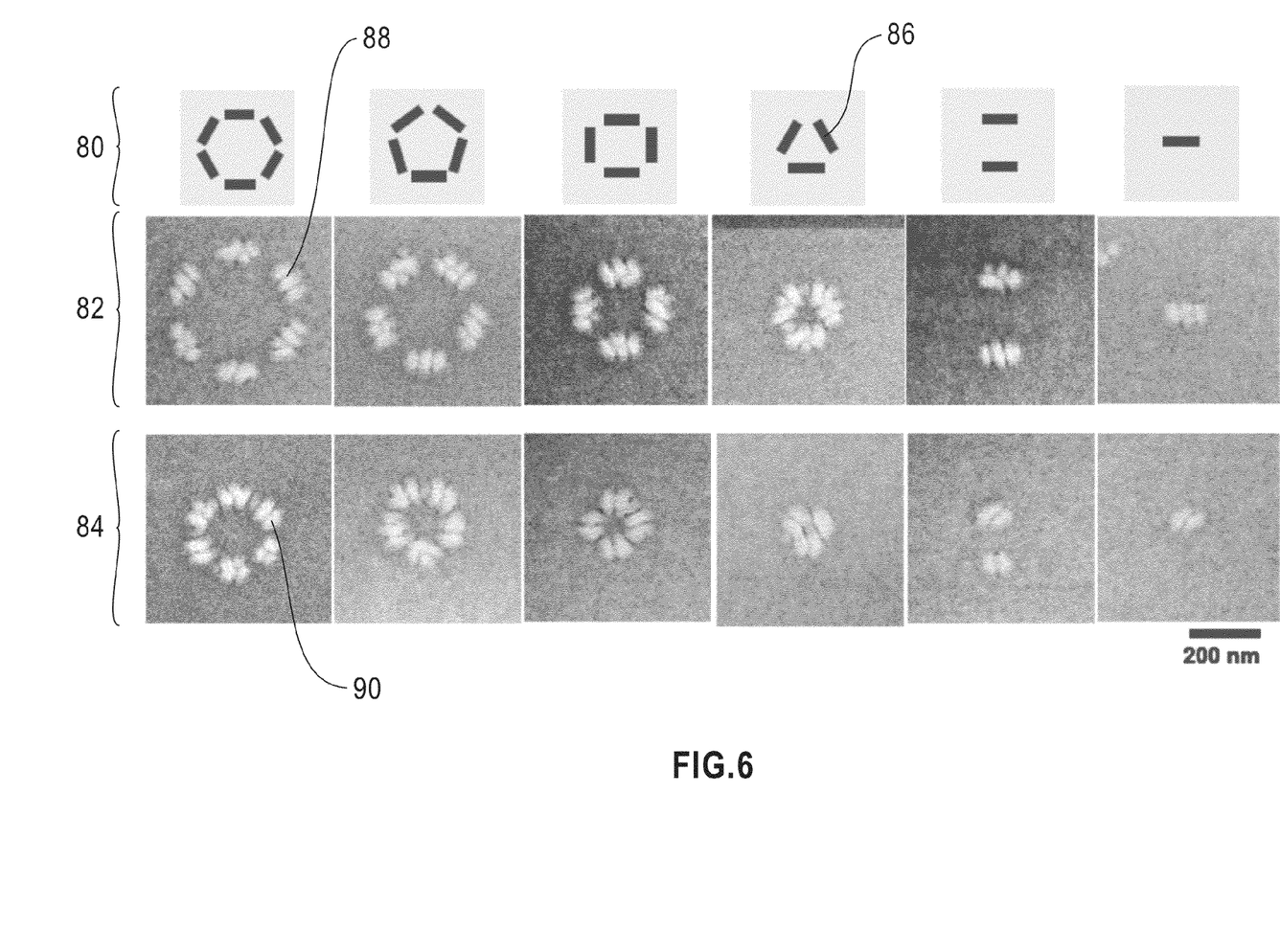
FIG. 6 is a set of plan view SEM images of the block copolymer microdomains formed on top of topographic pre-patterns having a variety of geometric shapes. The pre-pattern line segments making up the sides of each shape do not intersect. Each geometric shape has two sizes.

More specifically, referring again to FIG. 1, for asymmetric wetting block copolymers the thickness, t', is equal to or about equal to $L_0$. For symmetric wetting block copolymers the thickness, t', is equal to or about equal to $L_0/2$. Further, in the disclosed method, the ridge surface area has a height, h, of $L_0/2$ for both asymmetric and symmetric wetting block copolymers. The area of the ridge surface having height, h, of $L_0/2$ above the trench area can be more than 0% to 100%, more specifically about 20% to about 100%, even more specifically about 40% to about 100%, still more specifically about 60% to about 100%, or even more specifically about 80% to about 100% of the total area of the ridge surface. The ratio between the ridge surface area and trench surface area (referred to as the duty cycle) can be any non-zero positive value. That is, as long as there is a ridge surface area, the lamellar block copolymer pattern can be formed, as demonstrated by the various patterns in FIG. 6. The width, w, of the ridge surface area (FIG. 1) can be a positive value from greater than 0 to less than $2L_0$.

The substrate surface on which the block copolymer is disposed can comprise inorganic or organic materials such as metals, carbon, or polymers (photoresists). More particularly, the substrate surface on which the block copolymer is disposed can comprise any semiconducting material including, for example, Si, SiGe, SiGeC, SiC, Ge alloys, GaAs, InAs, InP, as well as other III-V or II-VI compound semiconductors. The substrate surface may also comprise a layered semiconductor such as Si/SiGe, or a semiconductor-on-insulator (SOI). In particular, the substrate surface is composed of a Si-containing semiconductor material, i.e., a semiconductor material that includes Si. The semiconductor material may be doped, undoped or contain both doped and undoped regions therein. Substrate surfaces comprising one of silicon native oxides, silicon oxides, and silicon nitrides are preferentially wetted by, for example, PMMA block components, but not by PS block components of a PS-b-PMMA block copolymer. Therefore, such surfaces can be used as preferential surfaces for PS-b-PMMA block copolymers.

In the following discussion of FIG. 2-6, materials and methods used to obtain the SEM images can be found in the EXAMPLE at the end of the Detailed Description section.

Annealing the block copolymer layer induces self-assembly of block copolymer to form perpendicularly oriented lamellar microdomains relative to the ridge surface plane. The lamellar microdomains disposed on the ridge surface form a detectable line pattern that can have a width greater than w (FIG. 1) of the ridge surface. This is illustrated in the composite images of FIG. 2 and FIG. 3, for two substrates whose sub-optical topographic pre-patterns comprise differently spaced lines. The dimensions of the surface features making up four of the pre-pattern lines are shown in top portion 30 of FIG. 2, and in top portion 40 of FIG. 3. The pre-pattern lines of FIG. 2 have a pitch, p, of 100 nanometers (nm) and a ridge width, w, of 25 nm. The pre-pattern lines in FIG. 3 have a pitch, p, of 150 nm and a ridge width, w, of 27 nm. The bottom SEM image 32 in FIG. 2 and the bottom SEM image 42, of FIG. 3 are plan view scanning electron micrographs (SEM) of each pre-pattern after coating a layer of polystyrene-poly(methyl methacrylate) block copolymer (PS-b-PMMA) thereon, and annealing the resulting film by thermal treatment to induce self-assembly of block copolymer, that results in the formation of the perpendicularly oriented lamellar microdomains 34 and 44 in FIG. 2 and FIG. 3 respectively. The perpendicularly oriented lamellae form over the ridge surfaces of the underlying pre-patterns, demonstrating that the lamellar orientation relative to the underlying surface plane is controlled by the thickness of the block copolymer layer.

Figure 2:
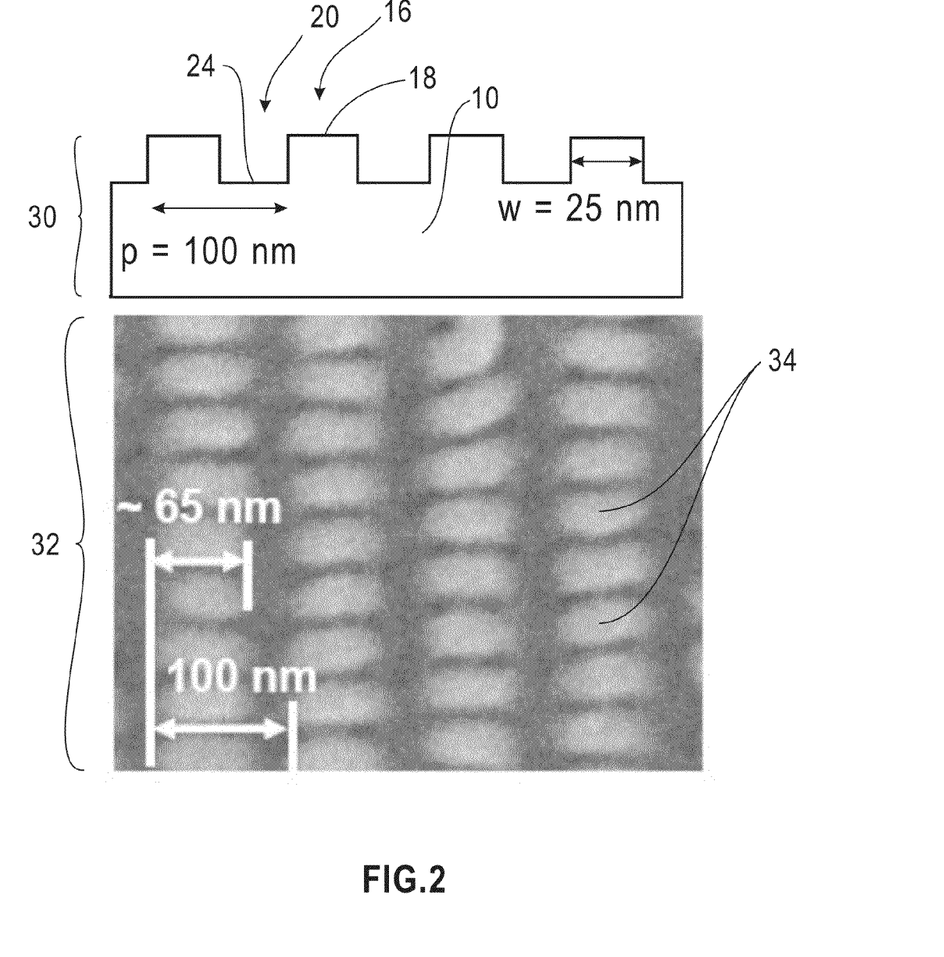
FIG. 2 is a plan view scanning electron micrograph (SEM) image of lamellar morphology on a topographic pre-pattern having 100 nm pitch. The variation of film thickness of PS-b-PMMA [poly(styrene-block-methyl methacrylate)) on the pre-pattern controlled the discrete line pattern formed.
Figure 3:
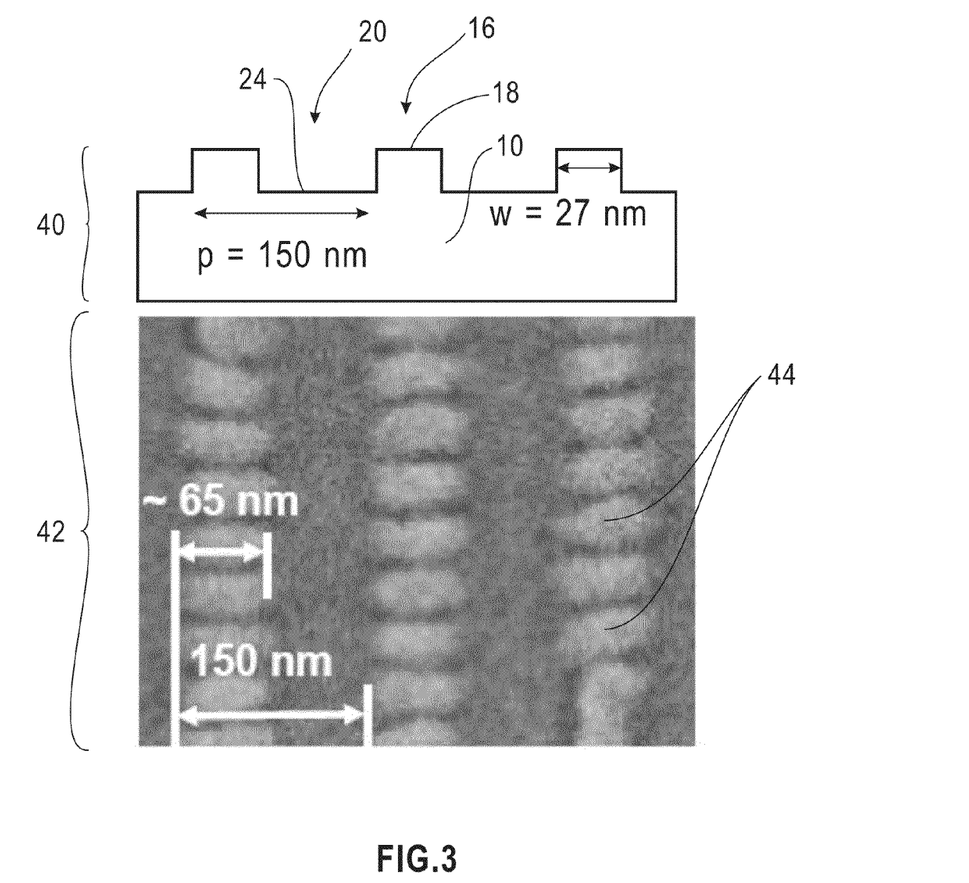
FIG. 3, like FIG. 2, is a plan view scanning electron micrograph (SEM) image of lamellar morphology on a topographic pre-pattern, except the pre-pattern has a 150 nm pitch. The block copolymer patterns of FIG. 2 and FIG. 3 replicate the pitch of the underlying pre-pattern.
Figure 7:
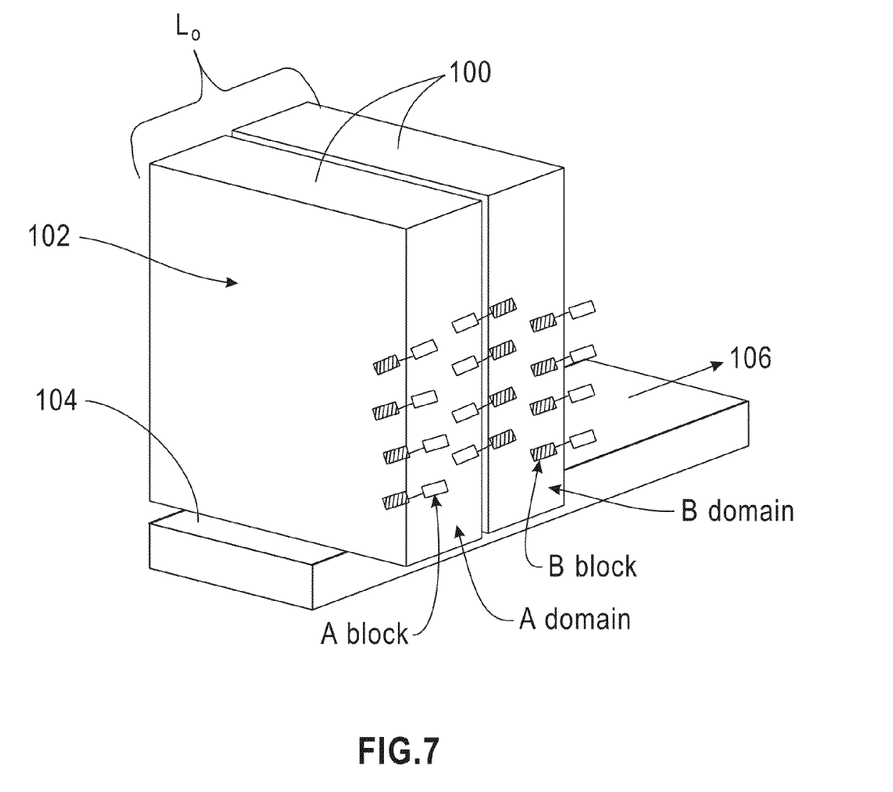
FIG. 7 is a schematic 3-dimensional representation of the orientation of two adjacent lamellar microdomains formed on a ridge surface using an A-B block copolymer, and the arrangement of the A blocks and the B blocks to form the A and B microdomains.

The block copolymer patterns in FIG. 2 and FIG. 3 each have two additional levels of order, long range order along the long axis of the pre-pattern surface feature (in this example, lines), and short range order normal to the long axis of the pre-pattern surface feature. The short range order is seen in the SEMs as a discontinuous stitch-like patterns across the long axis of the ridge surface. Each "stitch" is a perpendicularly oriented lamellar microdomain. The lamellar plane is also aligned transversely with respect to the long axis of the underlying pre-pattern line. The dark and bright regions in the stitches correspond to the PMMA and PS phases, respectively. The in-lens detector of the SEM detects different amounts of backscattered electrons from the PMMA and PS blocks, producing the observed contrast. In these two examples, the PMMA and PS block phases are aligned perpendicular to the lamellar plane, and parallel to the ridge surface plane. This is shown schematically in FIG. 7. In FIG. 7, the planes containing the two lamellar microdomains 100 are oriented perpendicular to the plane containing the ridge surface 104. The lamellar microdomains 100 are also oriented transversely to the long axis of the ridge surface, represented by the arrow 106. The arrangement of block component phases A and B within each lamellar microdomain 100 are also shown, where the stacking sequence is A-B B-A A-B. One lamellar microdomain 100 contains two sequential A blocks (labeled A domain), the other lamellar microdomain 100 contains two sequential B blocks (labeled B domain) of the A-B block copolymer. Also shown is $L_0$ which comprises the two lamellar microdomains 100. A polymer chain within the A and B domain phases can be in the form of a random coil, mesogen, helix, or a combination of the foregoing forms.

The long range order of the block copolymer pattern derives from a multitude of perpendicularly oriented lamellar microdomains (stitches), arranged along the long axis of a ridge surface as shown in FIG. 7. In a further embodiment, the perpendicularly oriented lamellar plane can also be aligned parallel to the long axis of the underlying pre-pattern line.

Thus, the lamellar microdomains whose lamellar planes are oriented perpendicular to the underlying surface plane appear as alternating patterns of light and dark gray in the SEMs of FIG. 2 and FIG. 3, and are located over the ridge surfaces of the underlying pre-pattern. The trench areas between the substrate pre-pattern lines appear dark gray, having no observable structure in the SEM due to the parallel orientation of lamellar plane relative to the plane containing the trench surface. The block copolymer pattern is also a line pattern and has a width of approximately 65 nm in each of the SEM images of FIGS. 2 and 3. This line width is approximately 2.5 times the width, w, of the underlying pre-pattern line. As shown, the pitch of the underlying pre-pattern lines is reproduced in the block copolymer patterns of FIG. 2 and FIG. 3. Thus, the block copolymer pattern has a line spacing of about 100 nm in FIG. 2, and about 150 nm in FIG. 3, corresponding to the pitch of the underlying pre-pattern. FIG. 2 and FIG. 3 illustrate pre-patterns having a constant line pitch. In an embodiment, the pre-pattern can also have a varying pitch.

Figure 4:
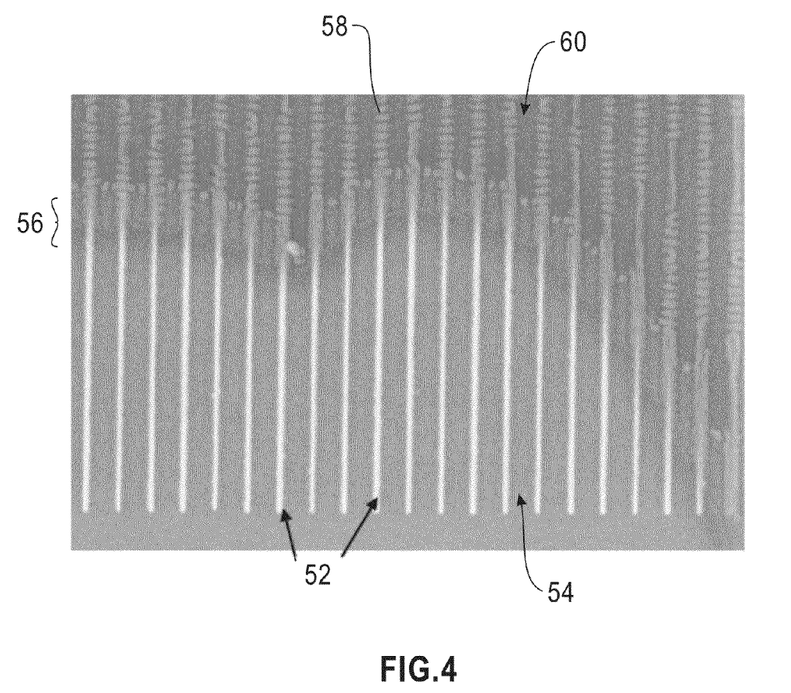
FIG. 4 is a plan view SEM image of a partially coated film. The lamellar microdomains locate on top of the ridge surfaces of the underlying pre-pattern.

FIG. 4 is a plan view SEM image of a pre-pattern whose ridge surfaces are also in the form of a set of parallel lines. The pre-pattern was partially coated with PS-b-PMMA and annealed by thermal treatment. Uncoated pre-pattern ridge surfaces 52 and uncoated trench surfaces 54 have lighter shades of gray in the SEM. The coating boundary is indicated generally at 56, wherein the block copolymer layer thickness gradually increases to a thickness suitable for formation of perpendicularly oriented lamellar microdomains 58 over the coated ridge surfaces, but not over the coated trench areas 60.

Figure 5:
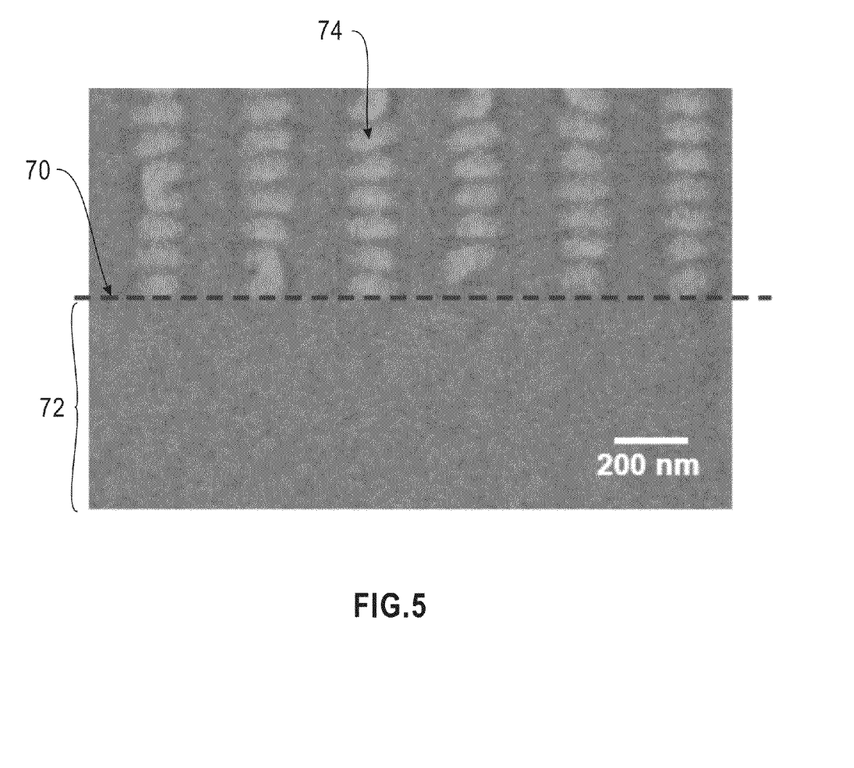
FIG. 5 is a plan view SEM image of the lamellar microdomains at the end of underlying pre-pattern lines. The ridge surface effectively controls the starting points of the block copolymer pattern.

FIG. 5 is a plan view SEM of a pre-pattern consisting of parallel lines that end at the point of the indicated dashed line 70. Area 72 has no ridge surfaces and is all trench (flat). The entire surface area of the pre-pattern has been coated with block copolymer, followed by thermal annealing to induce block copolymer self-assembly. The SEM of FIG. 5 demonstrates that the perpendicularly oriented lamellar microdomains 74 end at a point near the end of the underlying pre-pattern lines. This provides additional evidence that the perpendicularly oriented lamellar microdomains are centered over the ridge surfaces of the pre-pattern lines, and also that the pre-pattern ridge surfaces control the lateral placement of the perpendicularly oriented lamellar micro domains.

The length of the pre-pattern lines determines the number of perpendicularly oriented lamellar microdomains ("stitches") that can form on a ridge surface. This is demonstrated in FIG. 6, a composite image illustrating block copolymer patterns formed using a variety of geometric pre-patterns composed of 1 to 6 line segments (e.g., line segment, parallel line segments, triangle, square, pentagon, and hexagon). The top row of images indicated as 80 schematically shows the pre-pattern geometric figure used to generate the block copolymer patterns in the SEMs directly below each geometric figure. The middle row SEM images, 82, and bottom row SEM images, 84, compare different sizes of the geometric pre-patterns comprising different length line segments. In each case, the pre-pattern line segments 86 making up the geometric figures do not intersect. As seen in the SEMs, the middle row 82, having longer line segments per edge, produces 3 perpendicularly oriented lamellae per line segment, indicated as 88. The bottom row 84 having shorter line segments per edge in the pre-pattern produces 2 perpendicularly oriented lamellae per line segment, indicated as 90. In each case, the stitches comprising lamellar microdomains are aligned transversely to the long axis of the underlying pre-pattern line segment. In some cases, the stitches align at an angle other than transversely to the long axis of the underlying pre-pattern line. This can occur in particular when the lamellar microdomains are located near the ends of a pre-pattern line, or when located over defects in the underlying pre-pattern lines.

The term "defect" or "defects" as used herein refers to any unwanted discontinuity in the translational, orientational, or chemical compositional order of a pattern. For example, a defect can be an unwanted notch, crack, bulge, bend or other physical discontinuity in the surface feature of the pre-pattern, or a chemical compositional change in a surface area of a pre-pattern. In another example, when the block copolymer pattern is defined by alternating lamellae, it may be desirable that the lamellae in such a block copolymer pattern must be aligned along the same direction in order for the pattern to be considered defect-free. Defects in the lamellar patterns can have various forms, including dislocation (i.e., line defects arising from perturbations in the translational order), disclination (i.e., line defects arising from discontinuities in the orientational order), and the like. Although it is generally desirable to minimize defects, no restriction is placed on the number of defects per unit area in the pre-pattern or block copolymer pattern formed thereon.

There are many different types of block copolymers that can be used for forming the self-assembled block copolymer patterns. As long as a block copolymer contains two or more different polymeric block components having different surface affinities for the ridge surface areas, such two or more different polymeric block components are capable of self-assembling into microdomains having nano-sized structural units.

In an embodiment, the block copolymer consists essentially of a first polymeric block component A and a second polymeric block component B that are immiscible with each other. By immiscible is meant that homopolymers of each block component form a melt blend exhibiting multiple glass transition temperatures representing each homopolymer phase. Additionally, one of the components A and B is selectively removable without having to remove the other, so as to form either isolated and orderly arranged structural units composed of the un-removed component, or a continuous structural layer containing isolated and orderly arranged cavities formed after the removable component has been removed. Alternatively, the components A and B may simply have different electrical, optical, and/or magnetic properties, so that the ordered patterns composed of such components A and B can be used for fabricating different device structures.

With two chemically distinct blocks A and B, the block copolymer may contain any numbers of the polymeric block components A and B arranged in any manner. The block copolymer can have a linear or branched structure. For example, the block copolymer may have any one of the following formula:

More specifically, the block polymer is a linear diblock copolymer having the general formula of A-B. Specific examples of block copolymers that may be used for forming the self-assembled block copolymer patterns include, but are not limited to: polystyrene-block-poly(methyl methacrylate) (PS-b-PMMA), poly(ethylene oxide)-block-polyisoprene (PEO-b-PI), poly(ethylene oxide)-block-polybutadiene (PEO-b-PBD), poly(ethylene oxide)-block-polystyrene (PEO-b-PS), poly(ethylene oxide)-block-poly(methyl methacrylate) (PEO-b-PMMA), poly(ethylene oxide)-block-poly(ethyl ethylene) (PEO-b-PEE), polystyrene-block-poly(vinyl pyridine) (PS-b-PVP), polystyrene-block-polyisoprene (PS-b-PI), polystyrene-block-polybutadiene (PS-b-PBD), polystyrene-block-poly(ferrocenyl dimethylsilane) (PS-b-PFS), polybutadiene-block-poly(vinylpyridine) (PBD-b-PVP), and polyisoprene-block-poly(methyl methacrylate) (PI-b-PMMA).

The types of self-assembled microdomains formed by the block copolymer are readily determined by the volume fraction of the first block component A to the second block components B.

Specifically, when the volume ratio of the first block component A to the second block component B is greater than about 80:20, the block copolymer will form an ordered array of spheres.

When the volume ratio of the first block component A to the second block component B is less than about 80:20 but greater than about 65:35, the block copolymer will form an ordered array of cylinders composed of the second polymeric block component B in a matrix composed of the first polymeric block component A.

When the volume ratio of the first block component A to the second block component B is less than about 65:35 but is greater than about 35:65, the block copolymer will form alternating lamellae composed of the first and second polymeric block components A and B.

When the volume ratio of the first block component A to the second block component B is less than about 35:65 but greater than about 20:80, the block copolymer will form an ordered array of cylinders composed of the first polymeric block component A in a matrix composed of the second polymeric block component B.

When the volume ratio of the first block component A to the second block component B is less than about 20:80, the block copolymer will form an ordered array of spheres composed of the first polymeric block component A in a matrix composed of the second polymeric block component B.

Therefore, the volume ratio of the first block component A to the second block component B can be readily adjusted in the block copolymer in order to form desired self-assembled periodic patterns.

In a particular embodiment, the block copolymer used for forming the self-assembled periodic patterns is PS-b-PMMA. PS and the PMMA blocks in such a PS-b-PMMA block copolymer can each have a number average molecular weight ranging from about 10 kg/mol to about 100 kg/mol, with a number average molecular weight from about 20 kg/mol to about 50 kg/mole being more typical.

The surface energies of PS and PMMA have been reported to be $\gamma_{PS}$=40.7 dyn/cm and $\gamma_{PMMA}$=41.1 dyn/cm at 20° C. respectively. Water contact angles for polystyrene range around 84-91°, whereas for PMMA they are around 75°.

Typically, mutual repulsion between different polymeric block components in a block copolymer is characterized by the term $\chi N$, where $\chi$ is the Flory-Huggins interaction parameter and N is the degree of polymerization. The higher $\chi N$, the higher the repulsion between the different blocks in the block copolymer, and the more likely the phase separation therebetween. When $\chi N$ is much greater than 10 (referred to herein as the strong segregation limit), there is a strong tendency for the phase separation to occur between different blocks in the block copolymer.

For a PS-b-PMMA diblock copolymer, $\chi$ can be calculated as approximately 0.028+3.9/T, where T is the absolute temperature. Therefore, $\chi$ is approximately 0.0362 at 473° K (199.85° C.). When the number average molecular weight ($M_n$) of the PS-b-PMMA diblock copolymer is approximately 51 Kg/mol, with a molecular weight ratio (PS:PMMA) of approximately 50:50, the degree of polymerization N is about 500, so $\chi N$ is approximately 18.1 at 200° C. Alternatively, when $M_n$ of the PS-b-PMMA diblock copolymer is approximately 64 Kg/mol, with a number average molecular weight ratio (PS:PMMA) of approximately 66:34, the degree of polymerization N is about 622.9, so $\chi N$ is approximately 22.5 at 200° C.

Therefore, by adjusting one or more parameters such as the composition, the total number average molecular weight, and the annealing temperature, the mutual repulsion between the different block components in the block copolymer of the present invention can be readily controlled to effectuate desired phase separation between the different block components. The phase separation in turn leads to formation of self-assembled periodic patterns, which comprise repeating structural units, for example spheres and cylinders, composed of different block components, as described hereinabove. More specifically, the self-assembling block copolymer forms lamellar repeating structural units when annealed. In another embodiment, the block copolymer does not self-assemble to form microdomains comprised of spheres or cylinders.

The periodicity or the dimension ($L_0$) of the repeating structural units in the periodic pattern is determined by intrinsic polymeric properties such as the degree of polymerization N and the Flory-Huggins interaction parameter $\chi$. At the strong segregation limit, $L_0$ is approximately equal to $N^{2/3}\chi^{1/6}$. In other words, $L_0$ scales with the degree of polymerization N, which in turn correlates with the number average molecular weight $M_n$ and the number average molecular weight ratio between different polymeric block components. Therefore, by adjusting the composition and the total number average molecular weight of the block copolymer of the present invention, the dimensions of the repeating structural units can be readily tuned.

In order to form the self-assembled periodic patterns, the block copolymer can be first dissolved in a suitable solvent system to form a block copolymer solution, which can then be applied onto the pre-pattern to form a thin block-copolymer layer disposed thereon. Annealing the thin block-copolymer layer effectuates self-assembly between different polymeric block components contained in the block copolymer.

The solvent system for dissolving the block copolymer and forming the block copolymer solution may comprise any suitable solvent, including, but not limited to toluene, propylene glycol monomethyl ether acetate (PGMEA), propylene glycol monomethyl ether (PGME), and acetone. The block copolymer solution may contain the block copolymer at a concentration ranging from about 0.1 weight percent (wt %) to about 5 wt % based on total weight of the solution. More particularly, the block copolymer solution contains the block copolymer at a concentration ranging from about 0.5 wt % to about 1.5 wt %. In an embodiment, the block copolymer solution comprises about 0.5 wt % to about 1.5 wt % PS-b-PMMA dissolved in toluene or PGMEA.

The block copolymer solution can be applied to the pre-pattern by any suitable technique, including, but not limited to: spin casting, coating, spraying, ink coating, dip coating, and the like. More particularly, the block copolymer solution is spin cast onto the pre-pattern, followed by solvent removal, leaving a thin film of block copolymer disposed on the pre-pattern.

The entire substrate is annealed to effectuate self-assembly of the block copolymer. In particular, the block copolymer layer is thermally annealed at a temperature that is above the glass transition temperature ($T_g$) of the block copolymer but below the decomposition or degradation temperature ($T_d$) of the block copolymer. The thermal annealing step can be carried out at an annealing temperature of about 200° C. to about 300° C. The thermal annealing can be performed for a period of more than 0 hours to about 100 hours, and more particularly for about 1 hour to about 15 hours. The thermally annealed block copolymer self-assembles to form lamellar microdomains whose planar orientation is perpendicular to the underlying surface plane over the ridge surfaces of the underlying pre-pattern.

When the annealed block copolymer layer is subject to etching, the difference in the etch rates between the two lamellar regions of the block copolymer can be used to generate additional patterns when both lamellar regions are exposed to the surface. In these instances, a portion of the block copolymer layer can be selectively removed to provide a semiconductor device having a nano-scale pattern. Types of etching include any common etching applied in the manufacture of semiconductor devices, for example, dry-etching such as plasma etching, or wet-etching using selective solvents. Typically, dry etching processes are employed for etching at sub-50 nm dimensions.

Also disclosed are semiconductor devices manufactured using the above-described method. In an embodiment, a semiconductor device comprises a substrate, the substrate comprising a topographic pre-pattern comprising a ridge surface separated by a height, h, greater than 0 nanometers from a trench surface; and a layer comprising a block copolymer disposed on the substrate, the block copolymer comprising two or more block components, and the layer having a thickness of more than 0 nanometers over the ridge surface and the trench surface; wherein the layer comprises a block copolymer pattern having a periodicity of the topographic pre-pattern, the block copolymer pattern comprising microdomains of self-assembled block copolymer disposed on the ridge surface and the trench surface, wherein the microdomains disposed on the ridge surface have a different orientation compared to the microdomains disposed on the trench surface. In another embodiment, the microdomains of self-assembled block copolymer disposed on the ridge surface and the trench surface of the semiconductor device have a lamellar structure.

The above-described method permits a feature size less than 200 nm, more particularly less than 150 nm, and even more particularly less than 100 nm. Secondly, the method advantageously replicates the periodicity of the underlying pre-pattern in the annealed block copolymer layer.

EXAMPLE

The following example demonstrates the method using a model block copolymer, poly (styrene-block-methyl methacrylate) (PS-b-PMMA).

(1) Preparation of Topographically Pre-Patterned Substrates:

Topographic pre-patterns were prepared by e-beam lithography followed plasma etching of silicon wafer. The depth of the pre-patterns is controlled as half of the period of lamellae ($L_0$). In this example, since the $L_0$ of PS-b-PMMA was approximately 40 nm, pre-patterns were prepared having a height h (FIG. 1) of approximately 20 nm. The surface features of the pre-patterns had a variety of pitches (p) and widths (w).

(2) Block Copolymer Deposition:

The PS-b-PMMA had a number average molecular weight of 74.8 kg mol-1 (38 kg mol$^{-1}$ for PS and 36.8 kg mol$^{-1}$ for PMMA), and thus an $L_0$ of approximately 37 nm. Thin films of PS-b-PMMA were spin-coated from 1.2 wt % toluene solutions, based on total weight of the solution, onto the topographic pre-patterns to form about 60 nm thick films (approximately 1.5 $L_0$) after solvent removal.

(3) Thermal Annealing:

Subsequently the samples were annealed at 200° C. for 18 hours under nitrogen stream to induce the thermodynamically stable lamellar morphology.

The singular forms "a," "an," and "the" include plural referents unless the context clearly dictates otherwise. The endpoints of all ranges directed to the same characteristic or component are independently combinable and inclusive of the recited endpoint. In the description, all amounts, parts, ratios and percentages used herein are by weight unless otherwise specified.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A semiconductor device comprising a substrate, the substrate comprising a topographic pre-pattern comprising a ridge surface separated by a height, h, greater than 0 nanometers from a trench surface; and a layer comprising a block copolymer disposed on the substrate, the block copolymer comprising two or more block components, and the layer having a thickness of more than 0 nanometers over the ridge surface and the trench surface; wherein the layer comprises a block copolymer pattern having a periodicity of the topographic pre-pattern, the block copolymer pattern comprising microdomains of self-assembled block copolymer disposed on the ridge surface and the trench surface, wherein the microdomains disposed on the ridge surface have a different orientation compared to the microdomains disposed on the trench surface.

2. The semiconductor device of claim 1, wherein the microdomains have a lamellar structure.

3. The semiconductor device of claim 2, wherein the microdomains having the lamellar structure disposed on the ridge surface are oriented perpendicular to the ridge surface.

4. The semiconductor device of claim 2, wherein the microdomains having the lamellar structure disposed on the trench surface are oriented parallel to the trench surface.

5. The semiconductor device of claim 3, wherein the microdomains having the lamellar structure disposed on the ridge surface are aligned transversely to a long axis of the ridge surface.

6. The semiconductor device of claim 3, wherein the microdomains having the lamellar structure disposed on the ridge surface are aligned parallel to a long axis of the ridge surface.

7. The semiconductor device of claim 1, wherein the ridge surface is configured to have a preferential affinity for one of the two or more block components.

8. The semiconductor device of claim 1, wherein the block copolymer has two block components.

9. The semiconductor device of claim 1, wherein the block copolymer pattern does not comprise a sphere or cylinder of one of the two or more block components in a matrix of a second block component.

10. The semiconductor device of claim 1, wherein the block copolymer has a natural period of length, $L_0$; the layer has a thickness, t', over the ridge surface that is less than or equal to $L_0$; the layer has a thickness, t, over the trench surface, wherein t is less than t'; and
the height, h, is at least $0.5 L_0$.

11. The semiconductor device of claim 1, wherein the block copolymer has a natural period of length, $L_0$; the layer has a thickness, t', over the ridge surface that is less than or equal to $0.5 L_0$; the layer has a thickness, t, over the trench surface, wherein t' is less than t; and the height, h, is at least $0.5 L_0$.

12. The semiconductor device of claim 1, wherein the block copolymer has a first polymeric block component A and a second polymeric block component B, wherein a homopolymer of A is not miscible with a homopolymer of B.

13. The semiconductor device of claim 1, wherein the topographic pre-pattern is a line pattern, and the block copolymer pattern and the topographic pre-pattern have an identical pitch.

14. The semiconductor device of claim 1, wherein the block copolymer comprises a polystyrene block component and a poly(meth)acrylate block component.

15. The semiconductor device of claim 1, wherein the block copolymer comprises an A block component and a B block component, and a volume ratio of the A block component to the B block component is less than about 65:35 and is greater than about 35:65.

16. The semiconductor device of claim 1, wherein the block copolymer comprises an A block component and a B block component, and a volume ratio of the A block component to the B block component is less than about 80:20 and is greater than about 20:80.

* * * * *